United States Patent
Ahlers et al.

(10) Patent No.: US 6,812,524 B2
(45) Date of Patent: Nov. 2, 2004

(54) FIELD EFFECT CONTROLLED SEMICONDUCTOR COMPONENT

(75) Inventors: Dirk Ahlers, München (DE); Jens-Peer Stengl, Grafrath (DE); Jenoe Tihanyi, Kirchheim (DE); Hans Weber, Ainring (DE); Gerald Deboy, München (DE); Helmut Strack, München (DE); Armin Willmeroth, Augsburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/013,999

(22) Filed: Dec. 11, 2001

(65) Prior Publication Data

US 2002/0096708 A1 Jul. 25, 2002

(30) Foreign Application Priority Data

Dec. 11, 2000 (DE) .......................................... 100 61 528

(51) Int. Cl.[7] .................. H01L 29/76; H01L 29/94; H01L 31/062; H01L 31/113; H01L 31/119
(52) U.S. Cl. .................. 257/341; 257/342; 257/401
(58) Field of Search ................................ 257/341, 342, 257/401

(56) References Cited

U.S. PATENT DOCUMENTS

| 4,754,310 | A | | 6/1988 | Coe ............................ 357/13 |
| 5,216,275 | A | | 6/1993 | Chen ......................... 257/493 |
| 6,037,632 | A | * | 3/2000 | Omura et al. ............... 257/341 |
| 2002/0117715 | A1 | * | 8/2002 | Oppermann et al. ........ 257/339 |

FOREIGN PATENT DOCUMENTS

DE    198 15 907 C1    5/1999

* cited by examiner

*Primary Examiner*—Phat X. Cao
(74) *Attorney, Agent, or Firm*—Laurence A. Greenberg; Werner H. Stemer; Gregory L. Mayback

(57) ABSTRACT

A semiconductor component includes first and second connection zones formed in a semiconductor body, a channel zone surrounding the second connection zone in the semiconductor body, and a drift path that is formed between the channel zone and the first connection zone and contains a compensation zone. The compensation zone has a complementary conduction type with respect to the drift zone and includes at least two segments. A distance between the two adjacent segments is chosen such that the punch-through voltage between these segments lies in a voltage range that corresponds to the voltage range assumed by the voltage drop across the drift path at currents situated between the rated current and twice the rated current.

14 Claims, 5 Drawing Sheets

FIELD EFFECT CONTROLLED SEMICONDUCTOR COMPONENT

BACKGROUND OF THE INVENTION

Field of the Invention

The present invention relates to a semiconductor component, in particular an MOS transistor having first and second connection zones of a first conduction type, a channel zone of a second conduction type and a drift zone of a first conduction type, the drift zone formed between the channel zone and the first connection zone, and the channel zone formed between the second connection zone and the drift zone, a control electrode formed insulated from the second zone for controlling a conductive channel in the second zone between the second zone and the drift zone, a drift zone of the first conduction type formed between the second zone and the first zone, and at least one compensation zone.

Such a semiconductor component, in the form of a vertical MOSFET, is disclosed, for example, in J. Tihanyi: "A Qualitative Study of the DC Performance of SIPMOS Transistors", Siemens Forschungs-und Entwicklungsbericht, Vol. 9 (1980) No. 4, Springer Verlag, page 181, FIG. 1c. Such a MOSFET has an $n^+$-doped drain zone in the region of a back of a semiconductor body and an $n^+$-doped source zone in the region of a front of the semiconductor body. The source zone is surrounded in the semiconductor body by a $p^+$-doped channel zone. Extending between the channel zone and the drain zone is an $n^-$-doped drift zone formed adjacently to a $p^-$-doped zone that likewise adjoins the channel zone. A gate electrode insulated from the channel zone allows a conductive channel to be formed between the source zone and the drift zone when a driving potential is applied.

Such a semiconductor component in the form of a MOSFET having an n-doped drain zone, an n-doped source zone surrounded by a channel zone, and an n-doped drift path formed adjacently to a p-doped zone is also disclosed in U.S. Pat. No. 5,216,275 to Chen and by U.S. Pat. No. 4,754,310 to Coe.

Such MOS transistors are distinguished by a low turn-on resistance and a high breakdown voltage.

In the MOS transistors, the source zone and the channel zone are normally shorted by a source electrode, so that the p-doped zone adjoining the channel zone is at source potential. Even when the MOSFET is on, i.e., when a conductive channel has been formed in the channel zone between the source zone and the drift zone and there is a voltage between the source zone and the drain zone, a voltage drop is produced across the drift path. Such a configuration results in a potential difference between the p-doped zone and the drift path that is greatest close to the drain zone and causes a space-charge zone to form in the boundary region between the p-doped zone and the drift path. The space-charge zone can pinch off the conductive channel in the drift path.

German Published, Non-Prosecuted Patent Application DE 198 15 907 C1 discloses a semiconductor component that can be controlled by field effect and has an n-doped drain zone, an n-doped source zone, a p-doped channel zone surrounding the source zone, and an n-doped drift path formed between the source zone and the drain zone, with a number of p-doped zones spaced apart being formed in the drift path. For driving, a gate electrode is provided that is formed to be insulated from the channel zone. If the semiconductor component is off and a voltage is applied between the source and drain zones, a space-charge zone propagates starting from the source zone and progressively takes in the p-doped zones disposed apart in the drift path. As such, these zones and the adjoining regions of the drift zone are depleted, that is to say free charge carriers recombine and depletion of free charge carriers occurs in the drift path, which results in a high breakdown voltage. To turn on the semiconductor component again after it has been off, the p-doped regions disposed on a floating basis—that is to say, those not connected to a fixed potential—need to be discharged again. To such an end, an injector is provided that injects p-charge carriers into the drift zone, or into the p-doped zones.

SUMMARY OF THE INVENTION

It is accordingly an object of the invention to provide a semiconductor component that can be controlled by field effect that overcomes the hereinafore-mentioned disadvantages of the heretofore-known devices of this general type and that has a low turn-on resistance and a high breakdown voltage and in which pinch-off of the conductive channel in the drift zone is reduced in the on state.

With the foregoing and other objects in view, there is provided, in accordance with the invention, a semiconductor component, including a first connection zone of a first conduction type, a second connection zone of the first conduction type, a channel zone of a second conduction type, the channel zone having a conductive channel, a drift zone of the first conduction type, the drift zone formed between the channel zone and the first connection zone, the channel zone formed between the second connection zone and the drift zone, a control electrode for controlling the conductive channel in the channel zone between the second connection zone and the drift zone, the control electrode insulated from the second zone, at least one compensation zone of the second conduction type, the at least one compensation zone formed in the drift zone and having at least two segments disposed at a distance from one another, and the distance between two adjacent ones of the at least two segments being chosen such that a punch-through voltage between the adjacent segments corresponds at most to a voltage across the drift zone at twice a rated current. Preferably, the distance between two adjacent segments is chosen such that a punch-through voltage between the adjacent segments corresponds to a voltage across the drift zone between a rated current and two times the rated current.

The second connection zone is isolated by the channel zone from the drift zone that, starting from the channel zone, extends up to the first connection zone. In addition, a control electrode is used to form a conductive channel in the channel zone between the second connection zone and the drift zone.

The distance between the two adjacent segments is chosen such that the punch-through voltage between the two segments corresponds at most to the voltage that becomes established when, with these miconductor component turned on, the drift path has a current flowing through it that is twice the rated current and when the temperature of the semiconductor body is preferably no more than 150° C.

The rated current is the current at which the semiconductor component is configured for long-term operation. In such a context, the rated current is definitively determined by the housing and its ability to dissipate heat.

In the case of two regions having identical doping and isolated by a complementarily doped region, the "punch-through voltage" is a general term for the value of the potential difference between these regions at which value a space-charge zone starting from one of the two regions takes in the other of the two regions. In absolute values, the punch-through voltage is preferably below 10 V in such a context.

The semiconductor component according to the invention works as an MOS transistor, with the first zone serving as drain zone, the second zone serving as source zone, and the control electrode serving as gate electrode.

With the semiconductor component turned on, those segments of the compensation zone that are disposed on a floating basis in the drift zone, that is to say, the segments that are not connected to the channel zone, assume a potential value that is between the potential on the first connection zone and the potential on the channel zone, or the potential on the second connection zone shorted by the channel zone. The potential difference between these floating segments and the surrounding regions of the drift zone is lower than in the case of the prior art MOS transistors, in which the whole compensation zone is at source potential. Thereby, the "junction effect," which refers to the conductive channel being pinched off in the drift path, is reduced in the semiconductor component according to the invention.

When the semiconductor component is off, a space-charge zone is formed starting from the second connection zone, or the channel zone, and, as the voltage rises, progressively takes in the segments of the compensation zone that are further away from the channel zone.

In accordance with another feature of the invention, one of the segments of the compensation zone directly adjoins the channel zone.

In accordance with a further feature of the invention, the at least one compensation zone has more than two segments disposed at a distance from one another.

In accordance with an added feature of the invention, the compensation zone is produced in a column form.

In accordance with an additional feature of the invention, one of the segments has a relatively higher doping than an adjacent other one of the segments.

In accordance with yet another feature of the invention, the number of charge carriers of the first conduction type in the drift zone substantially corresponds to the number of charge carriers of the second conduction type.

In accordance with yet a further feature of the invention, in the drift zone, the number of charge carriers of the second conduction type is greater than the number of charge carriers of the first conduction type.

In accordance with yet an added feature of the invention, the number of charge carriers of the second conduction type in the drift zone is greater than the number of charge carriers of the first conduction type.

In accordance with a concomitant feature of the invention, the drift zone has a doping of between $5 \times 10^{14}$ cm$^{-3}$ and $5 \times 10^{15}$ cm$^{-3}$ and the distance between the adjacent segments is between 0.5 and 4 $\mu$m. In one embodiment, the drift zone has a doping of $5 \cdot 10^{14}$ cm$^{-3}$ and the distance between the adjacent segments is between 2 and 4 $\mu$m. In another embodiment, the drift zone has a doping of $2 \cdot 10^{15}$ cm$^{-3}$ and the distance between the adjacent segments is between 1 and 2 $\mu$m. In a third embodiment, the drift zone has a doping of $5 \cdot 10^{15}$ cm$^{-3}$ and the distance between the adjacent segments is between 0.5 and 1.5 $\mu$m.

The charge carrier concentrations in the compensation zone and in the regions of the drift zone that surround the compensation zone are preferably matched to one another such that there are approximately the same number of charge carriers of the first and of the second conduction type. As a result, when a reverse voltage is applied and the control electrode is not being driven, the compensation zones and the regions surrounding the compensation zones become fully depleted, that is to say, p-charge carriers migrate to the zone, or to the electrode, which is at the more negative potential and n-charge carriers migrate to the zone, or to the electrode, which is at the more positive potential. When a positive reverse voltage is applied between drain and source, p-charge carriers migrate to the source electrode and n-charge carriers migrate to the drain electrode. The effect of the compensation zone and the surrounding drift zone being depleted is that, when the maximum possible reverse voltage is present, there are no longer any free charge carriers in the drift zone before breakdown is reached, which results in a high breakdown voltage. In a fully depleted state, the potential in the drift path and in the segments of the compensation zone decreases steadily from the connection zone with the higher potential to the connection zone with the lower potential.

If the component is to be turned on again, the control electrode is driven by applying a suitable driving potential, so that a conductive channel forms in the channel zone. When the component is turned on again and a voltage is applied between the first and second connection zones that is lower than the voltage in the off case, the segments of the compensation zones, which are formed on a floating basis in the drift zone, initially remain charged because there are no free charge carriers present in the segments of the compensation zones.

In such a context, if the voltage difference between the channel zone or a segment of the compensation zone that is connected to the channel zone and a segment of the compensation zone that is disposed at a distance therefrom amounts to the value of the punch-through voltage between these two segments, the potential of the segment disposed at a distance from the channel zone is coupled to the potential of the channel zone. That is to say, the segment disposed at a distance is partially discharged, with its potential initially differing from the potential of the channel zone by the value of the punch-through voltage. If the component includes more than two segments of the compensation zone, this procedure is effected for all adjacent segments.

The individual segments would be discharged in optimum fashion when turning on again if all the segments were connected to the channel zone. However, such a connection results in the aforementioned drawbacks of the prior art, namely that the channel is pinched-off when the component is on.

The dimensioning of the invention, according to which the punch-through voltage corresponds at most to the voltage drop across the turned-on component at twice the rated current and, preferably, at least to the voltage drop across the drift path at the rated current, affords a very good compromise between the demands for rapid discharge of the compensation zones when turning on again and the least possible pinch-off of the channel in the on state. It is also possible to dispense with the use of an additional injector.

Other features that are considered as characteristic for the invention are set forth in the appended claims.

Although the invention is illustrated and described herein as embodied in a semiconductor component that can be controlled by field effect, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

In the figures of the drawings, unless stated otherwise, identical reference symbols denote identical parts and regions having the same significance.

The invention is explained below using an n-conductive MOS transistor. The invention naturally also can be applied to p-conductive transistors, for which purpose the n-conductive regions below need to be replaced with p-conductive regions, and the p-conductive regions below need to be replaced with n-conductive regions. In the following text, n-doped regions form doped regions of the first conduction type, and p-doped regions form doped regions of the second conduction type below.

Figure 1:
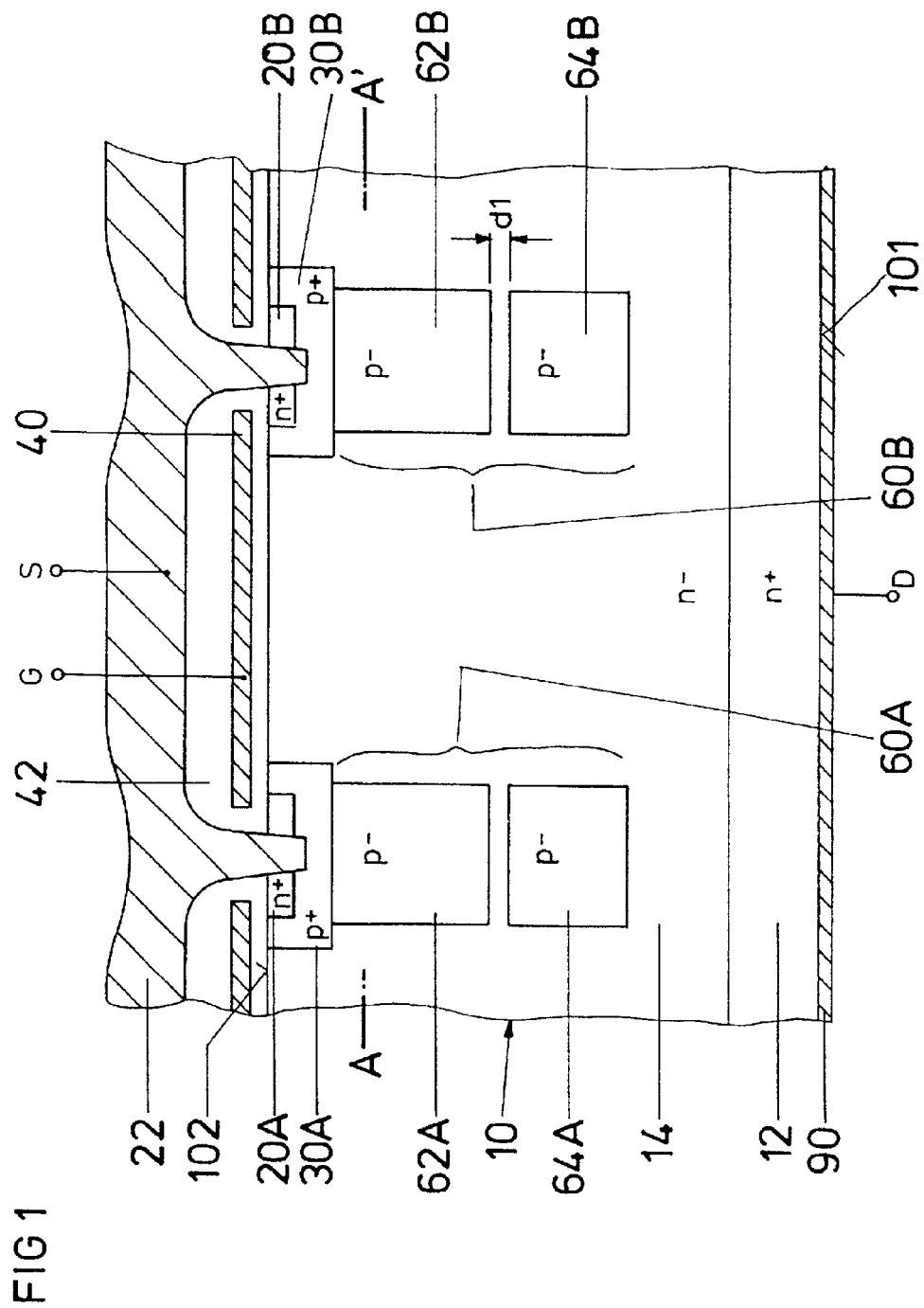
FIG. 1 is a cross-sectional view of a first exemplary embodiment of a vertically constructed semiconductor component according to of the invention.

FIG. 1 shows a cross-sectional view of a first exemplary embodiment of a semiconductor component according to the invention. The component includes a semiconductor body 10 that has an n-doped first connection zone 12 in the region of a back 101 and has an n-doped second connection zone 20A, 20B in the region of a front 102, which is opposite the back.

The second connection zone 20A, 20B, which is formed in the manner of a well in the exemplary embodiment shown in FIG. 1, is surrounded in the semiconductor body by a p-doped channel zone 30A, 30B likewise formed in the manner of a well. The channel zone 30A, 30B isolates the second connection zone 20A, 20B from an n-doped drift zone 14 that extends between the channel zone 30A, 30B and the first connection zone 12.

The semiconductor component shown in FIG. 1 works as a MOS transistor, with the first connection zone 12 serving as the drain zone of the transistor. In the exemplary embodiment, the back 101 of the semiconductor body 10 has had a metalized area 90 applied to it to form a drain electrode D. The second connection zone 20A, 20B serves as the source zone of the MOS transistor. The component shown in FIG. 1 has a plurality of source zones 20A, 20B, of which FIG. 1 shows two disposed at a distance from one another in the lateral direction of the semiconductor body 10. Formed above the semiconductor body 10 is a gate electrode 40, G that is insulated from the semiconductor body 10 by an insulating layer 42 and extends in the lateral direction of the semiconductor body 10, respectively from the second connection zone 20A, 20B through the channel zone 30A, 30B to the drift zone 14. Also provided is an electrode 22 insulated from the gate electrode G that serves as source electrode and is connected to the second connection zone 20A, 20B and also shorts the second connection zone 20A, 20B to the channel zone 30A, 30B.

The source zones 20A, 20B and the channel zones 30A, 30B surrounding the source zones 20A, 20B are respectively part of a "cell" of the semiconductor component. The source electrode 22 and the gate electrode 40 are, like the drain zone 12, and the drain electrode 90, common to all the cells of the MOS transistor. Each of the cells of the semiconductor component works like an MOS transistor, with the joint driving of all the cells by the gate electrode 40, the source electrode 22 and the drain electrode 90 connecting a multiplicity of such "small" MOS transistors, which together form the MOS transistor, in parallel. A preferred embodiment is shown in the cell-like configuration of the semiconductor component according to the invention in FIG. 1, which shows two cells disposed apart in the lateral direction. Correct operation of the component is actually ensured with a single cell.

According to the invention, the semiconductor component has at least one compensation zone 60A, 60B formed in the drift zone. The compensation zone 60A, 60B has at least two segments 62A, 64A, 62B, 64B disposed at a distance from one another. In the exemplary embodiment shown in FIG. 1, a compensation zone 60A, 60B formed in the manner of a column is provided below each channel zone 30A, 30B. The compensation zone extends in the vertical direction of the semiconductor body 10 from the channel zones 30A, 30B toward the drain zone 12. In the exemplary embodiment shown in FIG. 1, a first segment 62A, 62B is respectively connected to one of the channel zones 30A, 30B; second segments 64A, 64B of the compensation zones 60A, 60B are disposed at a distance from the first segments 62A, 62B below the first segments 62A, 62B.

Figure 2:
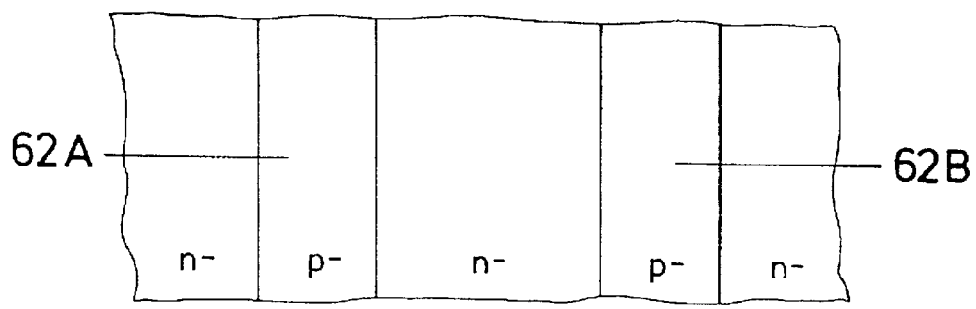
FIG. 2 is a cross-sectional view through the semiconductor component from FIG. 1 along section line A-A' showing a first embodiment of compensation zones of FIG. 1.

FIG. 2 the semiconductor component of FIG. 1 along section line A-A'. In the exemplary embodiment of FIG. 2, the compensation zones 62A, 62B are of elongate form in a lateral direction of the semiconductor body 10. The channel zones and source zones above the channel zones (not shown in FIG. 2) are matched to the geometry of the compensation zones 62A, 62B and are accordingly of elongate form.

Figure 3:
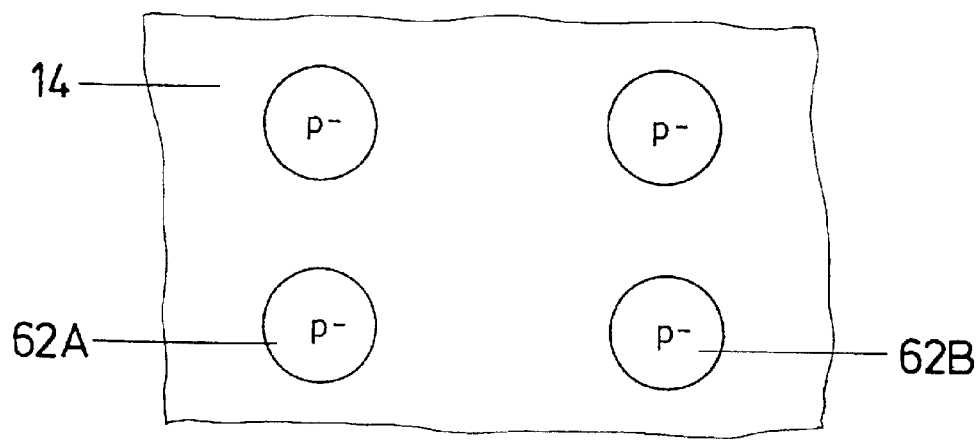
FIG. 3 is a cross-sectional view through the semiconductor component from FIG. 1 along section line A-A' showing a second embodiment of the compensation zones of FIG. 1.
Figure 4:
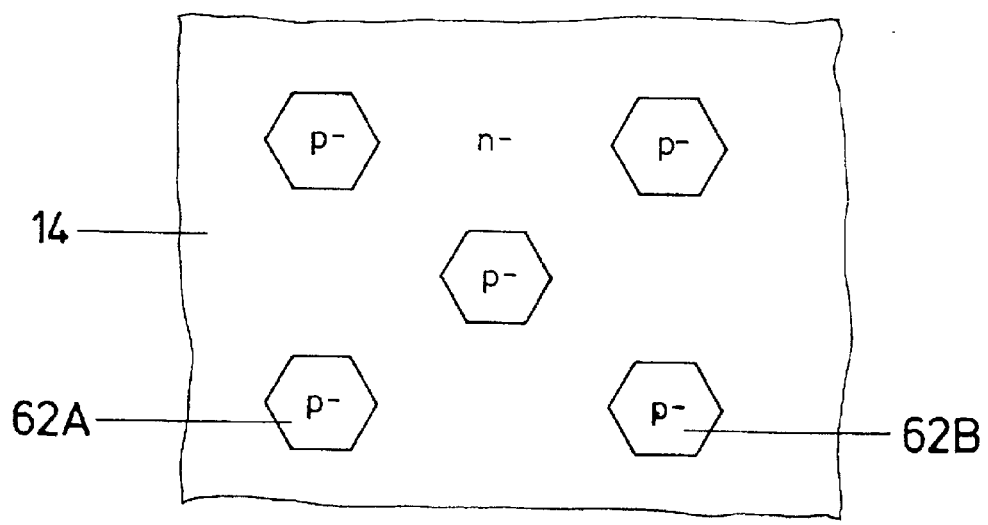
FIG. 4 is a cross-sectional view through the semiconductor component from FIG. 1 along section line A-A' showing a third embodiment of the compensation zones of FIG. 1.

FIG. 3 shows another exemplary embodiment, in which the compensation zones 62A, 62B are formed in the manner of columns having round cross sections. In the exemplary embodiment shown in FIG. 4, the compensation zones 62A, 62B are likewise formed in the manner of columns, but with hexagonal cross-sections.

According to the invention, the distance between the individual segments 62A, 64A and 62B, 64B of the compensation zones 60A, 60B is chosen such that the punch-through voltage between these segments corresponds at most to the voltage across the drift path at twice the rated current. The punch-through voltage denotes the maximum possible voltage difference between the two adjacent segments 62A, 64A and 62B, 64B. If the voltage difference between two adjacent segments reaches the value of the punch-through voltage, charge carriers are exchanged between these adjacent segments, which prevents a voltage difference from rising further.

The punch-through voltage is dependent on the doping of the segments 62A, 64A, 62B, 64B, on the doping of the drift zone 14 between the segments, and on the distance d1 between two adjacent segments.

Preferably, the upper segments 62A, 62B of the compensation zones 60A, 60B in FIG. 1 are more highly p-doped than the lower segments 62A, 62B.

The way in which the inventive semiconductor component works is explained below with reference to FIG. 1.

Initially, it is assumed that the semiconductor component has for a long time already been in a "quiescent state." In such a state, there is no gate-source voltage between the gate electrode G and the source electrode S and there is no drain-source voltage between the drain electrode D and the source electrode S so that there are free charge carriers in the compensation zones and in the drift zone. When a positive driving potential is applied to the gate electrode G, a conductive channel forms in the channel zone 30A, 30B between the source zone 20A, 20B and the drift zone 14. When a positive voltage is applied between the drain electrode 90 and the source electrode 22, a flow of charge carriers from the drain zone 12 to the source zone 20A, 20B results. In such a case, a voltage drop is produced across the drift path 14, with the potential of the drift path 14 being higher in the region of the lower segments 64A, 64B than in the region of the upper segments 62A, 62B. The upper segments 62A, 62B are connected to the channel zone 30A, 30B and to the source electrode 22 and are, thus, at low source potential. The lower segments 64A, 64B, which are disposed at a distance from the segments 62A, 62B, take up p-charge carriers from the drift path 14 and thereby assume a higher potential than the upper segments 62A, 62B. The potential difference between the lower segments 64A, 64B and the drift path 14 is lower in the case of the inventive semiconductor component than in the case of such components based on the prior art, in which the entire compensation zone is connected to the source electrode. The effect of pinch-off of the conductive channel in the drift path 14 is, therefore, less in the case of the inventive semiconductor component, as a result of the segments 62A, 64A and 62B, 64B being disposed apart, than in the case of such components based on the prior art.

If a driving potential is not applied to the gate electrode G, the MOS transistor is off when a positive voltage is applied between the drain electrode 90 and the source electrode 22. In such a case, starting from the channel zones 30A, 30B, space-charge zones propagate in the vertical direction of the semiconductor body 10. The compensation zones 60A, 60B become depleted as the reverse voltage increases and as the expansion of the space-charge zones increases. In other words, free p-charge carriers in the compensation zones 60A, 60B migrate to the source electrode, and free n-charge carriers migrate to the drain electrode D, which results in depletion of charge carriers in the drift zone 14 and in the compensation zones 60A, 60B. Preferably, the compensation zones 60A, 60B and the drift path 14 are doped such that the compensation zones 60A, 60B and the drift path 14 are each depleted fully, which means that there are no longer any free charge carriers at the maximum reverse voltage.

At the maximum reverse voltage, the same potential distribution then predominates, on a qualitative basis, in the compensation zones 60A, 60B and in the drift path 14. That is to say, the potential decreases from the drain electrode 90 to the channel zones 30A, 30B. A transverse field between the compensation zones 60A, 60B and the drift zone means that the potentials are somewhat different, however.

When the component is turned on, that is to say, when a positive driving potential is applied to the gate electrode G and there is a reduced drain-source voltage, those segments 62A, 62B of the compensation zones that are connected to the channel zones 30A, 30B quickly assume the value of the source potential. The segments 64A, 64B that are disposed at a distance therefrom and contain negatively charged acceptor atoms initially have a negative potential. If the charge reduction in the segments 62A, 62B when turning on again causes the voltage difference between the segments 62A, 64A and 62B, 64B to reach the value of the punch-through voltage between these segments, charge carriers, namely holes, flow out of the upper segments 62A, 62B in FIG. 1 into the lower segments 64A, 64B. Such prevents the potential difference between the two adjacent segments from becoming greater than the value of the punch-through voltage. The punch-through voltage between the two adjacent segments is dependent, among other things, on the distance d1. While, in the previously outlined case, in which the component has already been on for a long time, efforts are made to make the distance between the adjacent segments 62A, 64A and 62B, 64B as great as possible so as to make the potential difference between the segments 64A, 64B and the drift zone 14 as small as possible. It is desirable when turning on the component again to make the distance between the segments as short as possible in order to discharge the segment 64A, 64B that is not coupled to the channel zones 30A, 30B as rapidly as possible.

The dimensioning of the invention, according to which the distance between these segments 62A, 64A and 62B, 64B is chosen such that the punch-through voltage assumes a value that corresponds at most to the voltage drop across the drift path at twice the rated current, affords a very good compromise between these conflicting effects. The configuration results in a MOS transistor with a good control response, a high reverse voltage, and a rapid charge carrier reduction when turning on again. An additional injector is not necessary for the semiconductor component according to the invention.

The distance d1 between the adjacent segments 62A, 64A and 62A, 64B is preferably between 0.5 and 4 $\mu$m; the doping of the drift zone is between $5 \times 10^{14}$ cm$^{-3}$ and $5 \times 10^{15}$ cm$^{-3}$.

Figure 5:
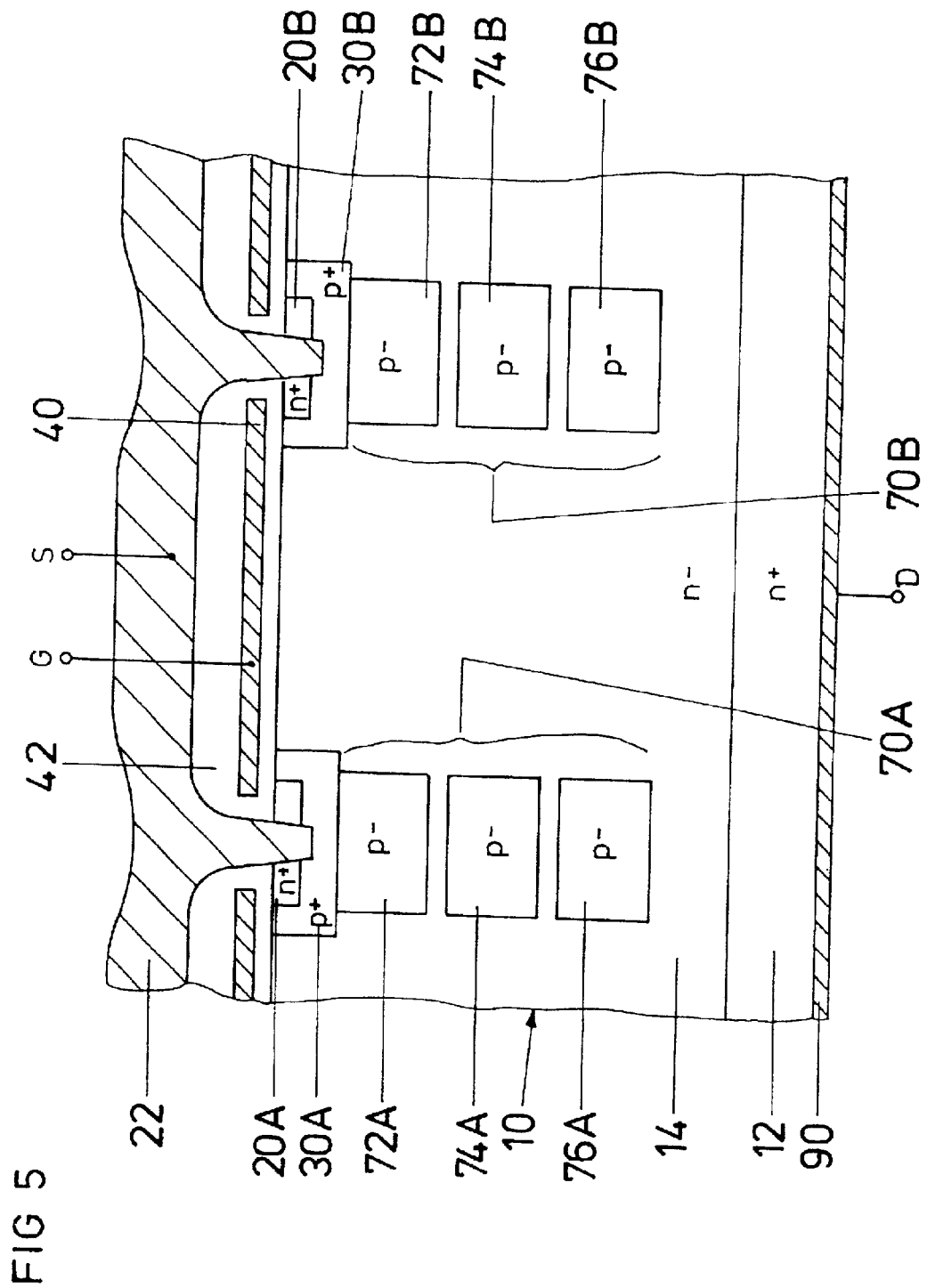
FIG. 5 is a cross-sectional view of a second exemplary embodiment of the semiconductor component of FIG. 1.

FIG. 5 shows another embodiment of a semiconductor component according to the invention, in which the compensation zones 70A, 70B are disposed below the channel zones 30A, 30B. Each of the compensation zones 70A, 70B include three segments 72A, 74A, 76A and 72B, 74B, 76B disposed at a distance from one another, with a respective one of the segments 72A, 72B being connected to the channel zone 30A, 30B.

Figure 6:
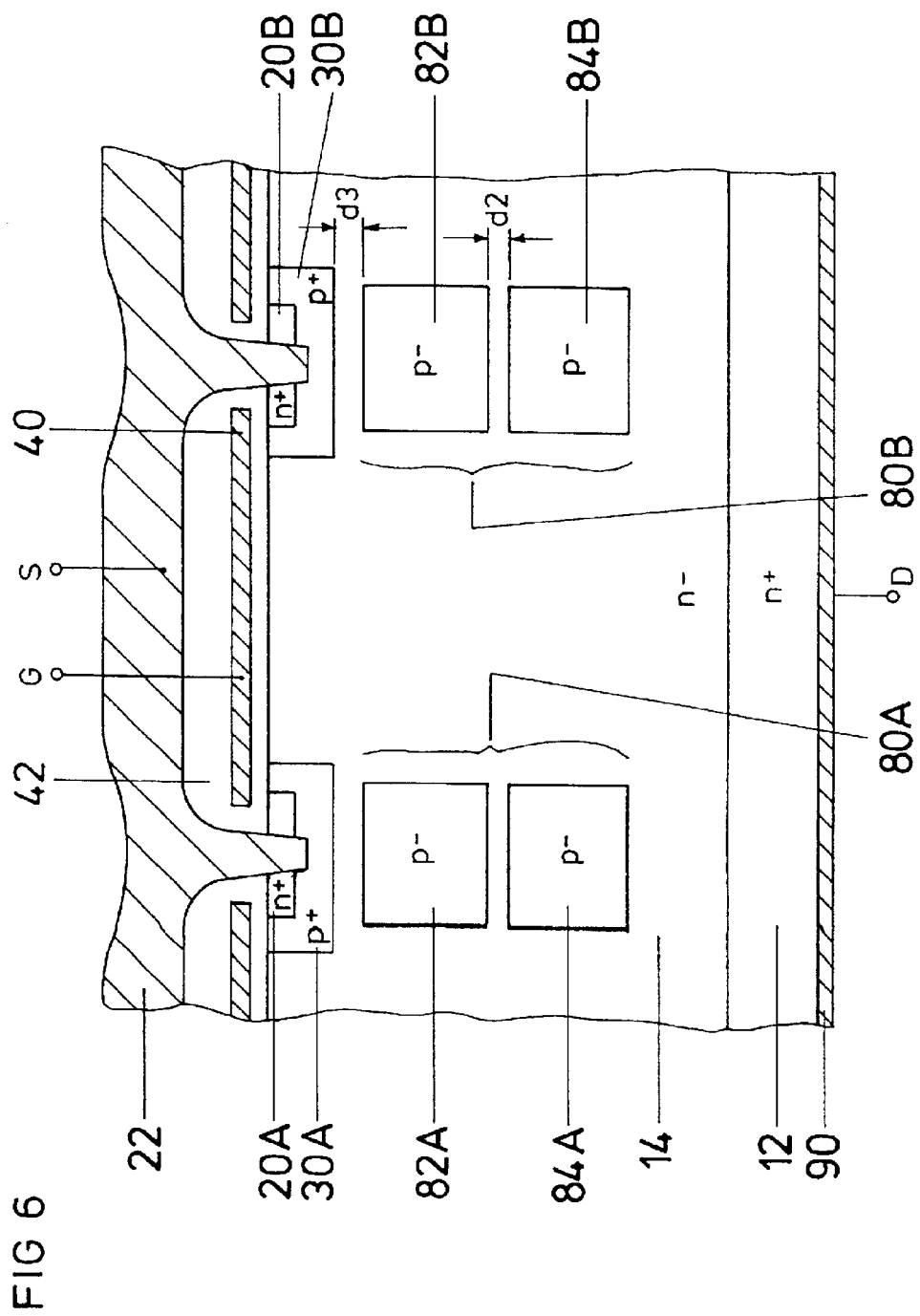
FIG. 6 is a cross-sectional view of a third exemplary embodiment of the semiconductor component of FIG. 1.

FIG. 6 shows a further embodiment of a semiconductor component according to the invention. The embodiment differs from the one shown in FIG. 1 by virtue of the fact that the segment 82A, 82B of the compensation zones 80A, 80B that faces the channel zone 30A, 30B is not connected to the channel zone. The distance between the segments 82A, 82B and the channel zone 30A, 30B in the vertical direction is d3; the distance between the segments 82A, 82B and the adjacent segments 84A, 84B is d2. The distances d2, d3 are preferably chosen such that the punch-through voltage between the channel zones 30A, 30B and the segments 82A, 82B and between the segments 82A, 84A and 82B, 84B is lower than the drain-source voltage at a drain-source current that corresponds approximately to twice the rated current.

The aforementioned dimensional specifications for the punch-through voltage, according to which the punch-through voltage corresponds at most to the voltage drop across the drift path at twice the rated current, preferably apply for a temperature of no more than 150° C. At higher temperatures, the voltage drop across the drift path rises for the same current.

Figure 7:
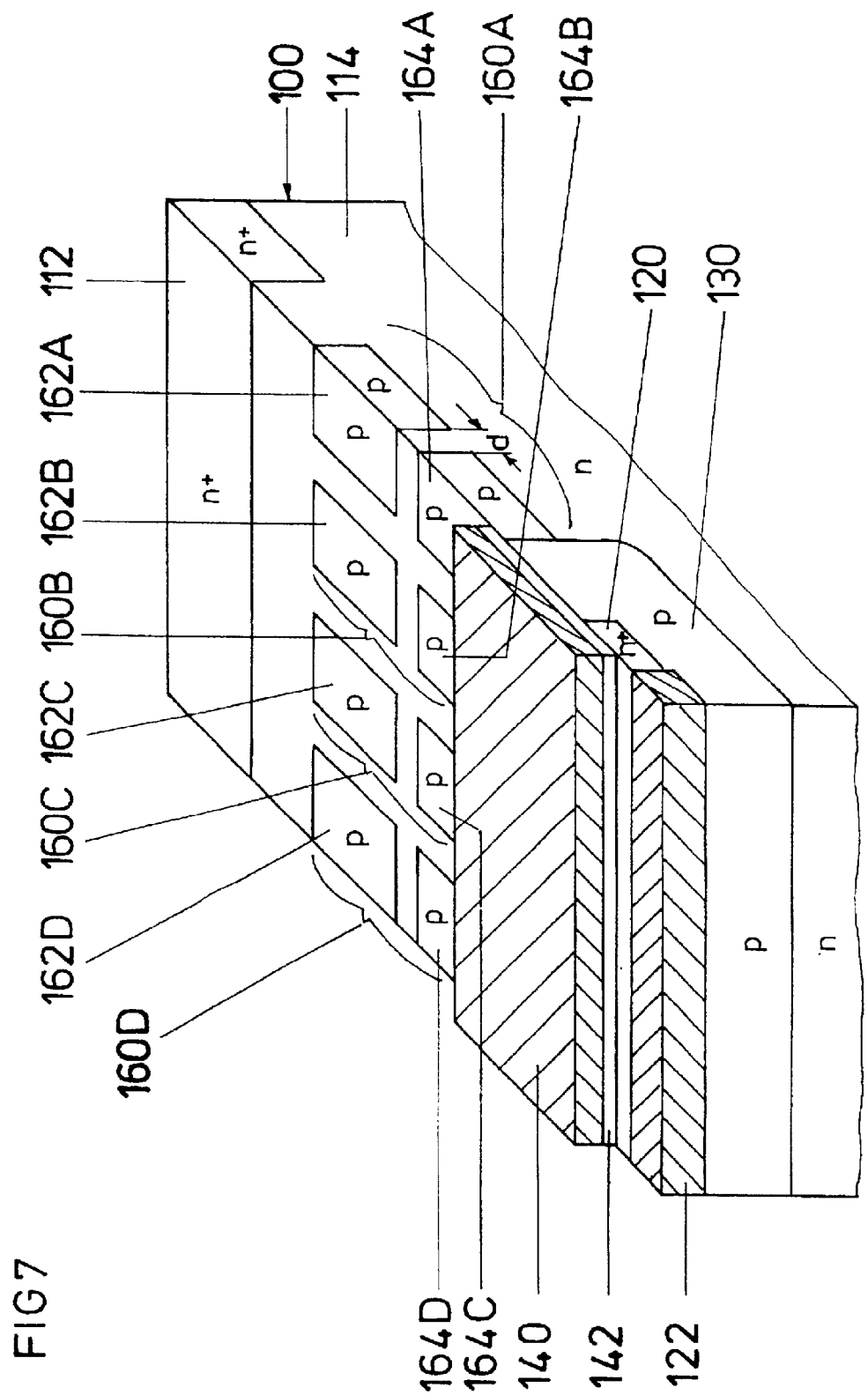
FIG. 7 is a perspective view of a laterally constructed embodiment of the semiconductor component of FIG. 1.

FIG. 7 shows a detail of a semiconductor body 100 in which a semiconductor component based on a further exemplary embodiment of the invention is implemented. The component shown is in the form of a MOSFET of lateral construction. The component has an n-doped semiconductor body 100 in which, from a surface of the semiconductor body 100, a heavily n-doped source zone 120 is formed in a p-doped channel zone 130. The source zone 120 and the channel zone 130 are shorted by a source electrode 122.

At a distance from the source zone 120 and the channel zone 130 in the lateral direction, a heavily n-doped drain zone is incorporated in the semiconductor body 100 from the surface. Formed between the drain zone 112 and the channel zone is an n-doped drift zone 114 in which p-doped compensation zones 160A, 160B, 160C, 160D are formed. Each of the compensation zones, disposed at a distance from one another, include two segments 162A, 164A, 162B, 164B, 162C, 164C, 162D, 164D formed at a distance from one another in the lateral direction of the semiconductor body 100. The compensation zones 160A, 160B, 160C, 160D are formed essentially in the manner of columns, and their longitudinal direction extends in the lateral direction of the semiconductor body 100. In the embodiment of FIG. 7, one of the segments 164A, 164B, 164C, 164D of each compensation zone 160A, 160B, 160C, 160D is connected to the channel zone 130.

In the embodiment, the distance d between the individual segments 162A, 164A, 162B, 164B, 162C, 164C, 162D, 164D of each of the compensation zones 160A, 160B, 160C, 160D is chosen such that the punch-through voltage between the two adjacent segments of a compensation zone 160A, 160B, 160C, 160D corresponds at most to the voltage drop across the drift path 114 at twice the rated current.

The component shown in FIG. 7 also has a gate electrode 140 that is disposed on the semiconductor body 100 so as to be insulated from the semiconductor body 100 by an insulating layer 142 and that extends in the lateral direction from the source zone 120 to the drift zone 114.

The component according to the invention has been explained above using an n-conductive MOSFET. The invention can naturally also be applied to p-conductive MOSFETs, in which case the n-doped regions described previously need to be replaced with p-doped regions, and vice-versa.

We claim:

1. A semiconductor component, comprising:

a first connection zone of a first conduction type;

a second connection zone of said first conduction type;

a channel zone of a second conduction type;

said channel zone having a conductive channel;

a drift zone of said first conduction type;

said drift zone formed between said channel zone and said first connection zone;

said channel zone formed between said second connection zone and said drift zone;

a control electrode for controlling said conductive channel in said channel zone between said second connection zone and said drift zone;

said control electrode insulated from said second zone;

at least one compensation zone of said second conduction type;

said at least one compensation zone formed in said drift zone and having at least two segments disposed at a distance from one another; and said distance between two adjacent ones of said at least two segments being chosen such that a punch-through voltage between said adjacent segments corresponds at most to a voltage across said drift zone at twice a rated current.

2. The semiconductor component according to claim 1, wherein one of said segments of said at least one compensation zone directly adjoins said channel zone.

3. The semiconductor component according to claim 1, wherein said at least one compensation zone is a column.

4. The semiconductor component according to claim 1, wherein said at least one compensation zone is produced in a column form.

5. The semiconductor component according to claim 1, wherein one of said segments has a relatively higher doping than an adjacent other one of said segments.

6. The semiconductor component according to claim 1, wherein:

said first conduction type has a number of charge carriers;

said second conduction type has a number of charge carriers; and said number of charge carriers of said first conduction type in said drift zone substantially corresponds to said number of charge carriers of said second conduction type.

7. The semiconductor component according to claim 1, wherein:

said first conduction type has a number of charge carriers;

said second conduction type has a number of charge carriers; and in said drift zone, said number of charge carriers of said second conduction type is greater than said number of charge carriers of said first conduction type.

8. The semiconductor component according to claim 1, wherein:

said first conduction type has a number of charge carriers;

said second conduction type has a number of charge carriers; and said number of charge carriers of said second conduction type in said drift zone is greater than said number of charge carriers of said first conduction type.

9. The semiconductor component according to claim 1, wherein said at least one compensation zone has more than two segments disposed at a distance from one another.

10. The semiconductor component according to claim 1, wherein:

said drift zone has a doping of $5 \cdot 10^{14}$ cm$^{-3}$; and said distance between said adjacent segments is between 2 and 4 $\mu$m.

11. The semiconductor component according to claim 1, wherein:

said drift zone has a doping of $2 \cdot 10^{15}$ cm$^{-3}$; and said distance between said adjacent segments is between 1 and 2 $\mu$m.

12. The semiconductor component according to claim 1, wherein:

said drift zone has a doping of $5 \cdot 10^{15}$ cm$^{-3}$; and said distance between said adjacent segments is between 0.5 and 1.5 $\mu$m.

13. The semiconductor component according to claim 1, wherein:

said drift zone has a doping of between $5 \times 10^{14}$ cm$^{-3}$ and $5 \times 10^{15}$ cm$^{-3}$; and said distance between said adjacent segments is between 0.5 and 4 µm.

14. A semiconductor component, comprising:

a first connection zone of a first conduction type;

a second connection zone of said first conduction type;

a channel zone of a second conduction type;

said channel zone having a conductive channel;

a drift zone of said first conduction type;

said drift zone formed between said channel zone and said first connection zone;

said channel zone formed between said second connection zone and said drift zone;

a control electrode for controlling said conductive channel in said channel zone between said second connection zone and said drift zone;

said control electrode insulated from said second zone;

at least one compensation zone of said second conduction type;

said at least one compensation zone formed in said drift zone and having at least two segments disposed at a distance from one another; and said distance between two adjacent ones of said at least two segments being chosen such that a punch-through voltage between said adjacent segments corresponds to a voltage across said drift zone between a rated current and two times the rated current.

\* \* \* \* \*